United States Patent [19]

Schwarz et al.

[11] Patent Number: 4,827,153

[45] Date of Patent: May 2, 1989

[54] CIRCUIT ARRANGEMENT FOR OPTIONALLY CONNECTING SIGNAL SOURCES TO A SIGNAL SINK

[75] Inventors: Henning Schwarz, Reinbek; Wolfgang Weltersbach, Hamburg, both of Fed. Rep. of Germany

[73] Assignee: U.S. Philips Corporation, New York, N.Y.

[21] Appl. No.: 146,520

[22] Filed: Jan. 21, 1988

[30] Foreign Application Priority Data

Feb. 7, 1987 [DE] Fed. Rep. of Germany ....... 3703785

[51] Int. Cl.⁴ .................... H02J 1/00; H03K 17/16
[52] U.S. Cl. ...................................... 307/80; 307/254
[58] Field of Search .............. 307/80, 81, 254, 243; 328/163

[56] References Cited

U.S. PATENT DOCUMENTS

| | | | |
|---|---|---|---|
| 3,873,846 | 3/1975 | Morio et al. | 307/80 X |
| 4,185,315 | 1/1980 | Miller | 307/80 X |
| 4,256,980 | 3/1981 | Asada et al. | 307/254 |
| 4,629,906 | 12/1986 | Heffner | 307/80 |
| 4,638,175 | 1/1987 | Bradford et al. | 307/80 X |

FOREIGN PATENT DOCUMENTS 58-62936  4/1983  Japan .

Primary Examiner—William M. Shoop, Jr.
Assistant Examiner—Sharon D. Logan
Attorney, Agent, or Firm—Marianne R. Rich

[57] ABSTRACT

In a circuit arrangement for optionally connecting the outputs of a plurality of signal sources which produce signals consisting of d.c. and a.c. components to an input of a signal sink, an interference-free switching is accomplished by providing that all the signals supplied by the signal sources from their outputs.

30 Claims, 2 Drawing Sheets

CIRCUIT ARRANGEMENT FOR OPTIONALLY CONNECTING SIGNAL SOURCES TO A SIGNAL SINK

BACKGROUND OF THE INVENTION

The invention relates to a circuit arrangement for optionally connecting the outputs of a plurality of signal sources which produce signals consisting of d.c. and a.c. components to an input of a signal sink.

Circuit arrangements of such a type are basically known from the field of the message transmission technology. They are, for example, used in the audio or video field as source switches whereby a plurality of audio or video signals can be connected to a corresponding reproduction/ display device.

For signals having a d.c. and an a.c. component interferences are produced when in such a circuit arrangement a connection is switched to a different connection, which, more specifically when sound signals are transmitted, become audible as clicks in adverse reproduction conditions can be extremely annoying for a listener. Similar interferences during the processing of video signals and other types of signals are also unwanted.

SUMMARY OF THE INVENTION

The invention has for its object to provide a circuit arrangement in which interferences of the type described above are avoided.

According to the invention, this object is accomplished in that all the signals supplied by the signal sources from their outputs have corresponding d.c. components. This achieves that, when a switch is effected from one signal source to another, the d.c. voltage jump which produces the interferences described in the foregoing do no longer occur.

It should here be noted that it is known per se to suppress during the transmission of a signal the d.c. components by means of an isolating capacitor or an isolating transformer and to convey only a.c. components. Such a procedure is however not recommendable when the d.c. component of a signal is to be co-transmitted or said components negatively affect the signal transmission properties of the connection between signal sources and signal sinks or require too high a design effort and cost, for example when construction in integrated circuit technique is the aim.

In one embodiment of the invention, one of the signal source which is used as the reference source, produces a d.c. voltage and d.c. voltage setting circuits are connected to the outputs of a further number of the signal sources, which match the d.c. components of the signals at the outputs of the signal sources to the d.c. voltage of the reference source. Thus the d.c. components of the signals are prevented from changing to different extents in response to signal fluctuations, drift or suchlike interferences. In addition, the d.c. components can be adapted to fluctuations represented by the reference source, which enable, for example, common duty cycle settings and suchlike.

In accordance with a further embodiment of the invention, one of the signal sources produces, as the reference source, a distinct direct current which is derived from the d.c. component of a current produced by one of the signal sources, the outputs of the two sources are each connected to a reference voltage source via a resistor and the products of the values of the currents and of the resistors are identical for the signal sources and the reference source. In this arrangement the—possibly fluctuating—d.c. component of the signal from a signal source controls the reference source. The d.c. voltages supplied from the outputs of the two signal sources are always in agreement. By combining this embodiment with the preceding embodiment it is furthermore possible to provide an arrangement in which a reference source arranged subsequent to the signal source sets the d.c. components of further signal sources.

Preferably, the reference sources and the signal sources are constituted by output terminals, which carry the same signals, of a signal processing stage, at which the output terminal constituting the reference source separates the direct current impressed thereupon and suppresses further signal components. For that purpose, the output terminal constituting the reference source can be connected to a filter circuit which is known per se. The output terminals of the signal processing stage are preferably in the form of a current mirror arrangement. This renders a simple decoupling of the output terminals and a simultaneous supply of strictly correlated d.c. components possible.

The circuit arrangements described in the foregoing also enable an interference-free switch-off of the (other) signals sources by optionally connecting either the output of the reference source or the outputs of the further signal sources to the signal sink. This provides in, for example, the audio applications a "click"-free muting of sound signal sources, the invention generally providing a "click"-free switching between the individual sound signal sources.

Advantageously, a control circuit is further provided to which a source selection signal is applied and which subsequently connects the input of the signal sink to the output of a selected signal source, and to which at least a muting signal is applied in response to which priority is given to connecting the input of the signal sink to the output of the signal source. Thus, the control circuit combines a selection of a desired signal source with "muting" of all the signals ources, the use of the word muting not meaning a restriction to sound signals. "Muting" has priority over a selection of one of the further signal sources, and more specifically then when the signal contains interferences to be eliminated and also at a change of signal source and then, for example, only for a short time. The muting signal can consequently be generated in different manners, for example by an interference detection circuit or different external devices. The muting signal is preferably produced by the signal processing stage, when the signal source it constitutes does not supply a signal.

The sub-claims describe further advantageous embodiment sof the invention.

An embodiment of the invention is shown, by way of example, in the accompanying drawings and will now be described in greater detail.

DETAILED DESCRIPTION OF THE INVENTION

Figure 1:
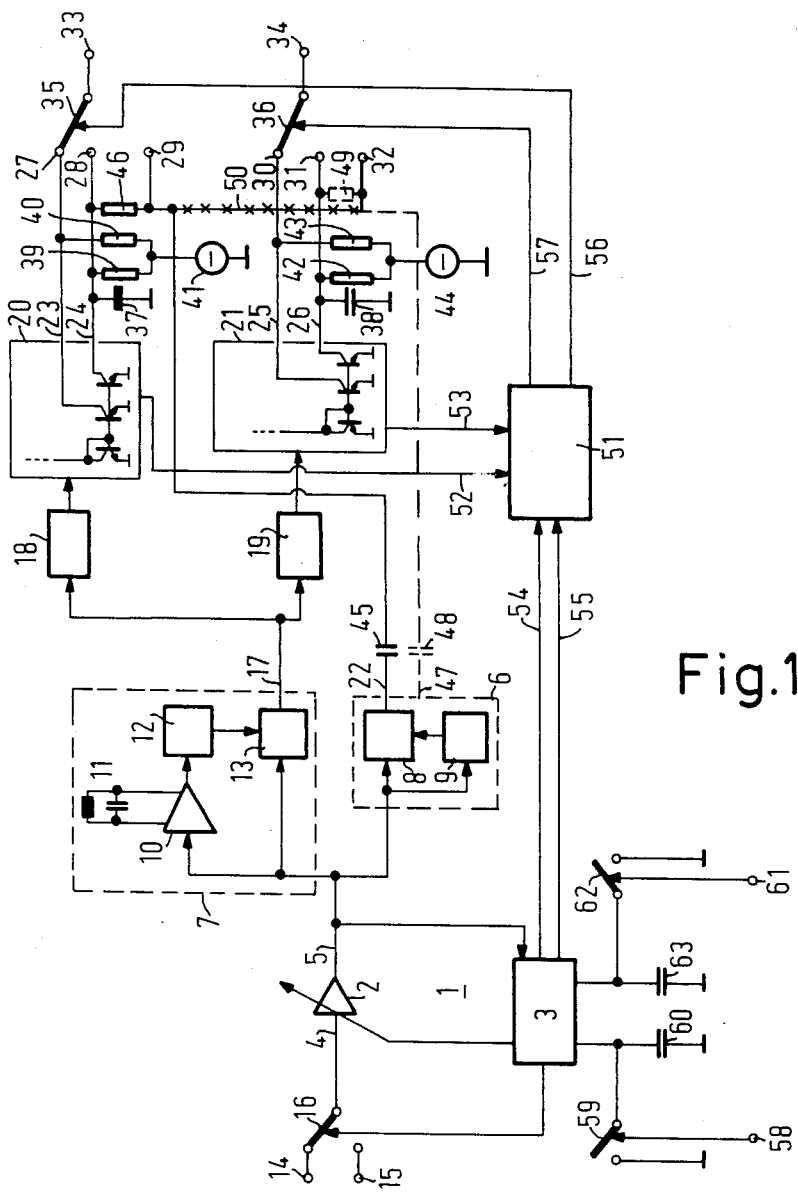
FIG. 1 is the schematic circuit diagram of an arrangement of the invention.

FIG. 1 shows, by way of example, as an application of the invention a section of a circuit arrangement for processing a sound signal in a multi-standard television receiver arrangement. This arrangement comprises an amplitude control arrangement 1 formed by a gain-controlled amplifier 2 and a control signal genreating stage 3. The signal which is applied to the input 4 of the amplifier 2 and is modulated on an intermediate frequency is amplified in known manner in the amplifier 2 by a gain factor whose value is derived from the signal at the output 5 of the amplifier 2 by the control signal generating stage 3.

The amplitude-controlled signal is applied from the output 5 of the control signal generating stage 3 to a synchronous demodulator 6 and a quadrature demodulatr 7. The synchronous demodulator 6 includes a multiplier 8 and a limiter amplifier 9, the quadrature demodulator 7 includes a frequency-selective reference amplifier 10 having a filter circuit 11, a limiter amplifier 12 and a multiplier 13.

The circuit arrangement of FIG. 1 receives at its first intermediate frequency input 14 a first intermediate frequency signal and at its second intermediate frequency input 15 a second intermediate frequency signal. In the present embodiment, the first intermediate frequency signal is a mixture of one or two intermediate frequency subcarriers frequency-modulated by a sound signal and an intermediate fequency picture carrier, the second intermediate signal comprises an intermediate frequency carrier amplitude-modulated by a sound signal. Consequently, the first intermediate frequency signal corresponds, for example, to the PAL-standard or the NTSC-standard, the second intermediate frequency signal to the SECAM-L standard. These signals are applied to the amplitude control arrangement 1, optionally via a change-over switch 16.

The quadrature demodulator 7 converts the first intermediate frequency signal with the aid of the intermediate frequency picture carrier in accordance with the intercarrier method into a further frequency-modulated signal at its output 17, which for each intermediate frequency carrier in the first intermediate frequency signal has a frequency-modulated sound signal. The frequency-modulated sound signals are separated via bandpass filters 18, 19 and converted into low-frequency sound signals by frequency demodulators 20, 21, which are supplied from the terminals 23, 24 and 25, 26, respectively.

The second intermediate frequency signal is demodulated in the synchronous demodulator 6 at whose terminal 22 a low-frequency signal appears.

The terminals to 24 and 22, 25, 26, respectively, constitute signals sources whose outputs 27 to 29 and 30 to 32, respectively, are optionally connectable to two inputs 33 and 34, respectively, of two signal sinks via source change-over switches 35, 36.

The terminals 23, 24 and 25, 26, respectively, are formed in the embodiment shown by the collectors of two parallel-controlled current mirror transistors in each of the frequency demodulators 20, 21, so that the currents on the terminals 23, 24 and the terminals 25, 26, respectively, are always in a constant ratio relative to other. Whereas the respective terminals 23 and 25 form signal sources for the supply of sound signals, the terminals 24 and 26 serve as reference sources, which produce an impressed direct current, which is derived from the d.c. components of the currents on the respective terminals 23 and 25. To that end, the terminals 24 and 26, respectively, are connected to ground via respective first and second filter capacitors 37, 38, causing the sound signals to be short-circuited. In addition, the terminals 23 and 24 are each connected to a reference voltage source via respective resistors 30, 40, the terminals 25, 26 are correspondingly connected via a resistor 42, 43 to a further reference voltage source 44. D.c. voltages which are determined by the filter capacitors 37, 38 are produced at the outputs 28 and 31, as the reference voltage sources 41, 44 also supply d.c. voltages. The resistance values for the resistors 39, 40 and 42, 43, respectively, are chosen such, that the products of the direct current and the resistance value, that is to say the d.c. voltages across the resistors, are always equal for the respective terminals 23, 24 and 25, 26. Consequently, the outputs 27, 28 and 30, 31, respectively, carry identical d.c. voltages or d.c. components, respectively.

The d.c. voltages or d.c. components at the outputs of the frequency demodulators 20, 21 depend inter alia on the phase position of the frequency-modulated sound signals and may fluctuate during operation of the described circuit arrangement. As, however, the d.c. voltage produced by the reference sources 24 and 26, respectively, always tracks the d.c. component of the respective signal sources 23 and 25, no d.c. voltage jump and consequently no interferences are produced, independently of the operating condition on switching the output 27 to the output 28 or the output 30 to the output 31. Preference can therefore be given to such a switching action as an interference or click-free muting.

The low-frequency sound signal is applied from the terminal 22, at which it is present, via a coupling capacitors 45 and 48 to the outputs 29 and 32, respectively to which the d.c. voltage from the reference source 24 is applied via a resistor 46. This provides an interference-free switching, also as regards the terminals 29, 32. The d.c. voltage produced by the reference sources 24, 26 will preferably be in agreement.

The arrangement described is suitable for the processing of stereo or multi-channel signals of a television signal of, for example, the B/G standard and a simple sound signal of the L-standard. The signal sinks constitute the stereo or the multi-sound channels of the television system. In a modified embodiment, the circuit arrangement can alternatively be used for stereo or multi-channel signals of a television signal in accordance with the L-standard. A correspondingly modified synchronous demodulator 6 then has a second terminal 47, from which a second low-frequency sound signal is applied to the output 32 via a second coupling capacitor 48. The d.c. voltage from the reference source 26 is applied to the output 32 via an additional resistor 49, and the capacitor 50 arranged between the outputs 29 and 32 in then interrupted. Otherwise, such an arrangement can also be used to process a simple low-frequency sound signal when the second coupling capacitor 48 is also connected to the terminal 22. Tolerances in the setting of the d.c. voltage produced by the reference voltage sources 24 and 26 do then not have any disadvantageous effect.

In the present embodiment the source switches 35, 36 form together with a logic section 51 a control circuit for optionally connecting the reference sources and the signal sources for the sound signals to the signal sinks.

The logic section 51 then receives via connections 52, 53 from the frequency demodulators 20, 21 muting signals which are produced in the frequency demodulators when these demodulators do not receive frequency-modulated signals via the bandpass filters 18, 19. The amplitude-control arrangement 1 applies to the logic section 51 a further muting signal via a conductor 54 and a source-selection signal via a conductor 55. The latter signal is used to change the standard when a switch is made from the reception of, for example, a B/G television signal to an L-television signal and vice versa.

The muting signals and the source selection signal are combined in the logic section to form two control signals for the source switches 35, 36 to which they are applied via control lines 56, 57. The source switches 35, 36 are so controlled by these signals that on reception of a television signal of, for example, the B/G standard with single-channel signals, only the first frequency demodulator 20 applies the sound signal via the output 27 to the input 33 of the first signal sink, whereas the second frequency demodulator 21 is switched off for the second low-frequency sound signal by the source switch 36, i.e. the output 31 of the reference source is connected to the input 34 of the second signal sink. On reception of, for example, a B/G stereo or multi-channel signal, also the output 30 of the second frequency demodulator 21 is connected to the input 34 of the second signal sink. On the reception of an L-television signal the source switches are switched to the respective outputs 29 and 32. If, on the other hand, no television signal occurs at the intermediate frequency inputs 14, 15 the two source switches and consequently the two inputs 33, 34 of the signal sinks are switched off by the further muting signal. Individual source switches 35 and 36, respectively, can also be switched off, independently of the television signals applied to the overall circuit arrangement via the connections 52, 53 when the frequency demodulators 20, 21 detect faulty signals or signal interruptions. The arrangement described then simultaneously performs the function of interference suppressor.

The control signal generating stage 3 of the amplitude control arrangement 1 has in the embodiment described, in addition to the generation of the control signal for the amplifier 2 also the function of generating the source selection signal of the further muting signal and also the control of the change-over switch 16. The further muting signal is generated, independently of the generation of the control signals, when at a decrease of the amplitude of the intermediate frequency signals these signals or the control signal for the amplifier 2 and consequently the signal amplitude of the signal sources reach a threshold value which signalizes that the intermediate frequency signal is received with such a low value that no useful sound signals can be recovered therefrom anymore, for example because the noise level becomes too high.

Muting the circuit can also be triggered by means of a muting command which is applied to the circuit arrangement of FIG. 1 from an external device, not shown, via a muting command input 58. The latter operates a short-circuiting switch 59, which by-passes a control capacitor 60 connected to the control signal generating stage 3, the capacitor being made inoperative thereby. The control capacitor 60 is charged to a voltage which is derived from the signal at the output 5 of the amplifier 2 and from which the control signal for the capacitor is recovered. The reduction in this voltage by operating the short-circuiting switch 59 triggers in the control signal generating stage 3 the muting signal on the line 54 in a similar manner as the reduction in the amplitudes of the intermediate frequency signals.

The control signal generating stage 3 is further provided with a standard change-over command input 61 to which a standard change-over command is applied by which a L-control capacitor 63 is short-circuited via a further short-circuiting switch 62, when a circuit arrangement, not shown, detects the reception of, for example, a B/G television signal. If such a reception is not detected, the short-circuiting switch 62 is inoperative. Thus, a change-over switching is made at one hand via the standard change-over command input 61 to one of the control characteristics of the control signal generating stage 3, and more specifically, for example, to a peak value control during the synchronous pulse peaks on the reception of, for example, a B/G television signal and to an average value control on the reception of an L-television signal. At the other hand, the source selection signal to be applied over the line 55 to the logic section 51 is, inter alia, recovered therefrom.

The common external control of the control signal generating stage 3 and the logic section 51 makes it possible to omit external inputs to the logic section. This is advantageous when an implementation of the circuit arrangement of FIG. 1 in integrated circuit technique is wanted.

Figure 2:
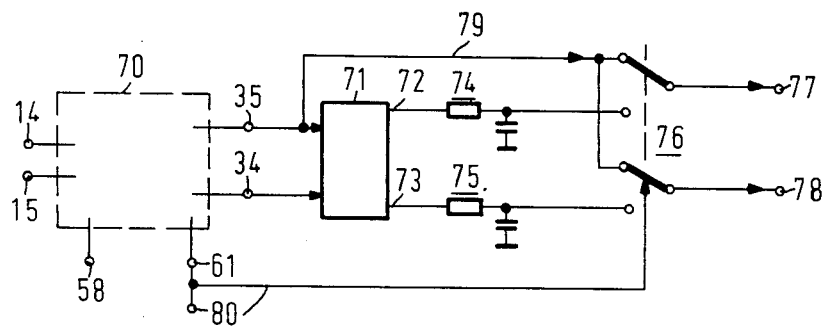
FIG. 2 is a schematic circuit diagram in which the arrangement shown in FIG. 1 is used.

FIG. 2 shows in rough outline a block circuit diagram for an arrangement for receiving and processing a sound signal in a multi-standard television receiver. Therein the circuit arrangement of FIG. 1 is denoted by reference numeral 70. Components corresponding to those in FIG. 1 are given the same reference numerals. The low-frequency sound signals are applied frm the inputs 33, 34 to a stereo multi-channel decoder 71 constituting a signal sink, from whose outputs 72, 73 the sound signals for the right-hand and left-hand stereo sound channels, respectively are supplied. Each of these signals passes through equalizing circuits 74 or 75, respectively, (deemphasis), which cancel the frequency response distortion occurring at the transmitter end during frequency demodulation and are applied via a stereo-source change-over switch 76 to a pair of sound outputs 77, 78. For the reception of a L-television signal with low-frequency sound signal a line 79 which by-passes the stereo-multichannel decoder 71 and the equalizer circuits 74, 75 is directly connected to the stereo-source change-over switch 76. Consequently, also the missing frequency response distortion at the transmitter end of this sound signal is taken account of. The stereo-source change-over switch 76 is controlled by the standard-changeover command via a standard-changeover line 80.

What is claimed is:
1. A circuit arrangement for interference-free signal switching comprising:
 (a) means for connecting at least one output of a plurality of signal sources to and input of a signal sink, said signal sources providing signals consisting of d.c. and a.c. components; and
 (b) means for matching said d.c. components of said signals so that they correspond to each other.
2. A circuit arrangement as claimed in claim 1, characterized in that one of the signal sources produces as a reference source a d.c. voltage and that d.c. voltage setting circuits are connected to the outputs of further signal sources, which match the d.c. components of the signals at the outputs of the signal sources to the d.c. voltage of the reference sources 3. A circuit arrangement as claimed in claim 2, characterized in that at least one of the d.c. voltage setting circuits (45, 46 and 48, 49, respectively) includes a coupling capacitor via which the signal from the signal source is applied to its output, and also a resistor for feeding-in the d.c. voltage at the output.

4. A circuit arrangement as claimed in claim 1, characterized in that one of the signal sources produces as a reference source an impressed direct current, which is derived from the d.c. component of an impressed current supplied by a further one of the signal sources, that the outputs of the two sources are connected each via a resistor to a reference voltage and the products of the values of the current an of the resistor are the same for the signal sources and the reference source.

5. A circuit arrangement as claimed in claim 4, characterized in that the reference sources and the signal sources are formed by the output terminals carrying the same signals of a signal processing stage and that at the output terminal the direct current impressed there is separated and further signal components are suppressed.

6. A circuit arrangement as claimed in claim 5, characterized in that the output terminals of the signal processing stage are constituted by a current mirror arrangement.

7. A circuit arrangement as claimed in claim 1, characterized in that the signal sources supply sound signals.

8. A circuit arrangement as claimed in claim 6, characterized by a control circuit to which a source selection signal is applied and which subsequently connects the input of the signal sink to the output of a selected signal source, and to which at least one muting signal is applied, in that it connects the input of the signal sink with priority to the output of the reference source.

9. A circuit arrangement as claimed in claim 8, characterized in that the muting signal is produced when the signal source it constitutes does not supply a signal.

10. A circuit arrangement as claimed in claim 9, characterized in that it is used in a multi-standard television receiver arrangement which includes for the sound signal of each television standard a signal processing stage which constitutes a signal source one of the signal processing stages further forming a reference source and the outputs of the remaining sources are connected to d.c. voltage setting circuits.

11. A circuit arrangement as claimed in claim 10, characterized by an amplitude control arrangement for setting mutually matched signal amplitudes of the signal sources and having a control characteristic which is switchable for individual signal sources, which in addition applies the source selection signal to the control circuit and also a muting signal when the signal amplitude of the selected signal source decreases to below a threshold value.

12. A circuit arrangement as claimed in claim 11, characterized in that the control characteristic of the amplitude control arrangement is determined by at least one control capacitor and that with the object of producing the source selection signal and the muting signal the control capacitors are optionally made inoperative by means of an externally applied muting or standard change-over command.

13. A circuit arrangement as claimed in claim 2, characterized in that the signal sources supply sound signals.

14. A circuit arrangement as claimed in claim 3, characterized in that the signal sources supply sound signals.

15. A circuit arrangement as claimed in claim 4, characterized in that the signal sources supply sound signals.

16. A circuit arrangement as claimed in claim 5, characterized in that the signal sources supply sound signals.

17. A circuit arrangement as claimed in claim 6, characterized in that the signal sources supply sound signals.

18. A circuit arrangement as claimed in claim 2, characterized by a control circuit to which a source selection signal is applied and which subsequently connects the input of the signal sink to the output of a selected signal source and to which at least one muting signal is applied in that it connects the input of the signal sink with priority to the output of the reference source.

19. A circuit arrangement as claimed in claim 3, characterized by a control circuit to which a source selection signal is applied and which subsequently connects the input of the signal sink to the output of a selected signal source and to which at least one muting signal is applied in that it connects the input of the signal sink with priority to the output of the reference source.

20. A circuit arrangement as claimed in claim 4, characterized by a control circuit to which a source selection signal is applied and which subsequently connects the input of the signal sink to the output of a selected signal source and to which at least one muting signal is applied in that it connects the input of the signal sink with priority to the ouptut of the reference source.

21. A circuit arrangement as claimed in claim 5, characterized by a control circuit to which a source selection signal is applied and which subsequently connects the input of the signal sink to the output of a selected signal source and to which at least one muting signal is applied in that it connects the input of the signal sink with priority to the output of the reference source.

22. A circuit arrangement as claimed in claim 13, characterized by a control circuit to which a source selection signal is applied and which subsequently connects the input of the signal sink to the output of a selected signal source and to which at least one muting signal is applied in that it connects the input of the signal sink with priority to the output of the reference source.

23. A circuit arrangement as claimed in claim 14, characterized by a control circuit to which a source selection signal is applied and which subsequently connects the input of the signal sink to the output of a selected signal source and to which at least one muting signal is applied in that it connects the input of the signal sink with priority to the output of the reference source.

24. A circuit arrangement as claimed in claim 15, characterized by a control circuit to which a source selection signal is applied and which subsequently connects the input of the signal sink to the output of a selected signal source and to which at least one muting signal is applied in that it connects the input of the signal sink with priority to the output of the reference source.

25. A circuit arrangement as claimed in claim 16, characterized by a control circuit to which a source selection signal is applied and which subsequently connects the input of the signal sink to the output of a selected signal source and to which at least one muting signal is applied in that it connects the input of the signal sink with priority to the output of the reference source.

26. A circuit arrangement as claimed in claim 17, characterized by a control circuit to which a source selection signal is applied and which subsequently connects the input of the signal sink to the output of a selected signal source and to which at least one muting signal is applied in that it connects the input of the signal sink with priority to the output of the reference source.

27. A circuit arrangement as claimed in claim 8, characterized in that it is used in a multi-standard television receiver arrangement which includes for the sound signal of each television standard a signal processing stage which constitutes a signal source one of the signal processing stages further forming a reference source and the outputs of the remaining sources are connected to d.c. voltage setting circuits.

28. A circuit arrangement as claimed in claim 8, characterized in that it is used in a multi-standard television receiver arrangment which includes for the sound signal of each television standard a signal processing stage which constitutes a signal source one of the signal processing stages further forming a reference source and the outputs of the remaining sources are connected to d.c. voltage setting circuits.

29. A circuit arrangement as claimed in claim 9, characterized in that it used in a multi-standard television receiver arrangement which includes for the sound signal of each television standard a signal processing stage which constitutes a signal source one of the signal processing stages further forming a reference source and the outputs of the remaining sources are connected to d.c. voltage setting circuits.

* * * * *